United States Patent
Gans et al.

(10) Patent No.: US 6,388,926 B1
(45) Date of Patent: *May 14, 2002

(54) INTEGRATED CIRCUIT HAVING FORCED SUBSTRATE TEST MODE WITH IMPROVED SUBSTRATE ISOLATION

(75) Inventors: Dean Gans; Kevin Devereaux, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/361,009

(22) Filed: Jul. 27, 1999

Related U.S. Application Data (63) Continuation of application No. 09/031,148, filed on Feb. 26, 1998, now Pat. No. 5,933,378.

(51) Int. Cl.[7] ............................................... G11C 29/00
(52) U.S. Cl. ..................................... 365/201; 324/158.1
(58) Field of Search ........................ 365/201; 371/21.1; 324/158.1

(56) References Cited

U.S. PATENT DOCUMENTS

| | | | |
|---|---|---|---|
| 5,212,442 A | 5/1993 | O'Toole et al. | 324/158 R |
| 5,229,316 A | 7/1993 | Lee et al. | 437/67 |
| 5,596,538 A | * 1/1997 | Joo | 365/201 |
| 5,642,318 A | * 6/1997 | Knaack et al. | 365/201 |
| 5,684,746 A | * 11/1997 | Oowaki et al. | 365/201 |
| 5,706,235 A | 1/1998 | Roohparvar et al. | 365/201 |
| 5,717,643 A | 2/1998 | Iwanami et al. | 365/201 |
| 5,727,001 A | 3/1998 | Loughmiller | 371/28 |
| 5,825,782 A | 10/1998 | Roohparvar | 371/21.1 |
| 5,841,691 A | 11/1998 | Fink | 365/149 |
| 5,950,145 A | * 9/1999 | Roohparvar | 371/21.1 |

* cited by examiner

Primary Examiner—Trong Phan
(74) Attorney, Agent, or Firm—Schwegman, Lundberg, Woessner & Kluth, P.A.

(57) ABSTRACT

An integrated circuit is described which includes a test mode circuit that allows a substrate of the integrated circuit to be forced to a voltage level dictated by an external connection during a test operation, and provides an improved substrate isolation from the external connection during non-test operations. Both n-channel transistor and p-channel transistor isolation circuit embodiments are described. An integrated circuit memory device is described which incorporated the test mode and isolation circuits. The external connection can be coupled to a negative voltage during non-test operation which is more negative than a threshold voltage below a substrate voltage without inadvertently coupling the external connection and substrate together.

34 Claims, 6 Drawing Sheets

INTEGRATED CIRCUIT HAVING FORCED SUBSTRATE TEST MODE WITH IMPROVED SUBSTRATE ISOLATION

This application is a Continuation of U.S. Ser. No. 09/031,148, filed Feb. 26, 1998 now U.S. Pat. No. 5,933,378.

TECHNICAL FIELD OF THE INVENTION

The present invention relates generally to integrated circuits and in particular the present invention relates to integrated circuits with substrate isolation circuitry.

BACKGROUND OF THE INVENTION

Many types of integrated circuits employ on-chip substrate bias generators (also known as "charge pumps") for enhanced performance by lowering the junction capacitance between diffused areas and the substrate, and by reducing the body effect on integrated field-effect transistors ("FETs"). Charge pumps are typically used on complimentary metal-oxide semiconductor ("CMOS") memory circuits such as static random-access memories ("SRAMs") and dynamic random-access memories ("DRAMs"), but are not limited to these applications.

Figure 1:
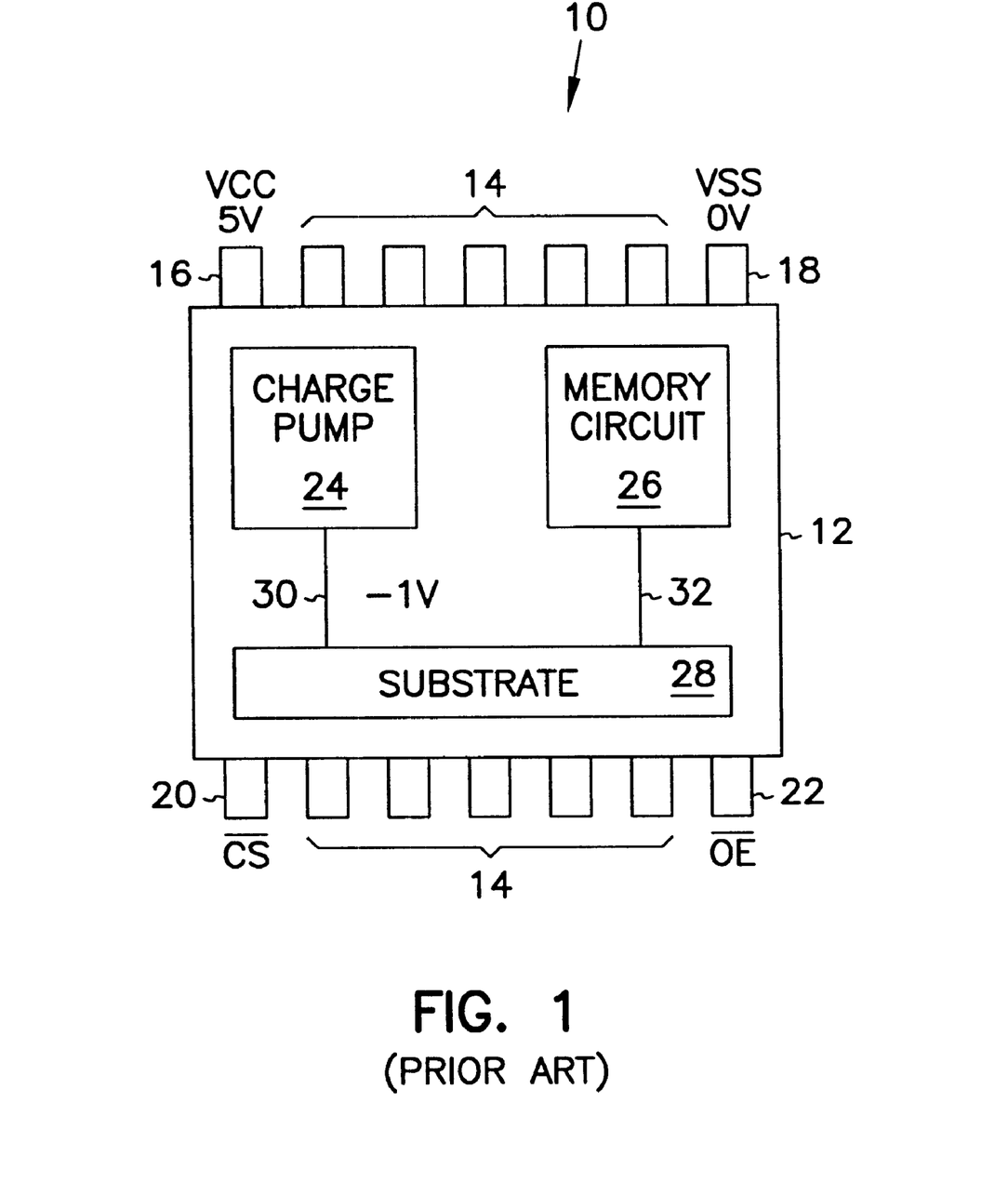
FIG. 1 is a simplified block diagram of a prior art integrated circuit memory device.

Referring now to FIG. 1, a simplified block diagram of a packaged integrated memory circuit 10 includes a package 12, external package pins 14, and dedicated package pins 16, 18, 20, and 22. External package pins 14 typically provide electrical connection for address buses and control functions for the memory. Pin 16 provides electrical connection to a first power supply voltage VCC, pin 18 provides electrical connection to a second power supply voltage VSS, pin 20 receives an inverted chip select signal, and pin 22 receives an inverted output enable signal. Pins 14–22 are only shown as being representative of atypical memory circuit but other varied configurations are possible. It is important to note that the substrate is not connected to any of the external package pins.

Inside the package, the integrated circuit includes a primary memory circuit 26, a charge pump 24, and a substrate 28. The charge pump 24 and memory circuit 26 are integrated together in a single integrated circuit, which is in physical and electrical contact with the substrate 28. Conductors 30 and 32 are shown only to illustrate the substrate voltage. The charge pump 24 is powered by VCC and VSS and generates a –1 volt VBB voltage for driving the substrate. In turn, the entire substrate is biased to –1 volts, including the portion underlying the memory circuit 26.

Integrated circuit memory circuits are typically tested at wafer sort where, since the integrated circuit has not yet been packaged, the substrate can be readily electrically contacted. During testing, the positive power supply voltage VCC and the substrate voltage VBB are varied in order to stress certain failure mechanisms and identify both failed and marginally performing circuits. Once the integrated circuits are packaged, however, access to the substrate is lost and the ability to stress failure mechanisms related to the substrate voltage is diminished. U.S. Pat. No. 5,212,422, incorporated herein by reference, describes a circuit for forcing the internal substrate voltage VBB once the integrated circuit has been packaged to allow more thorough testing. A portion of U.S. Pat. No. 5,212,422 is provided in the following paragraphs.

Figure 2:
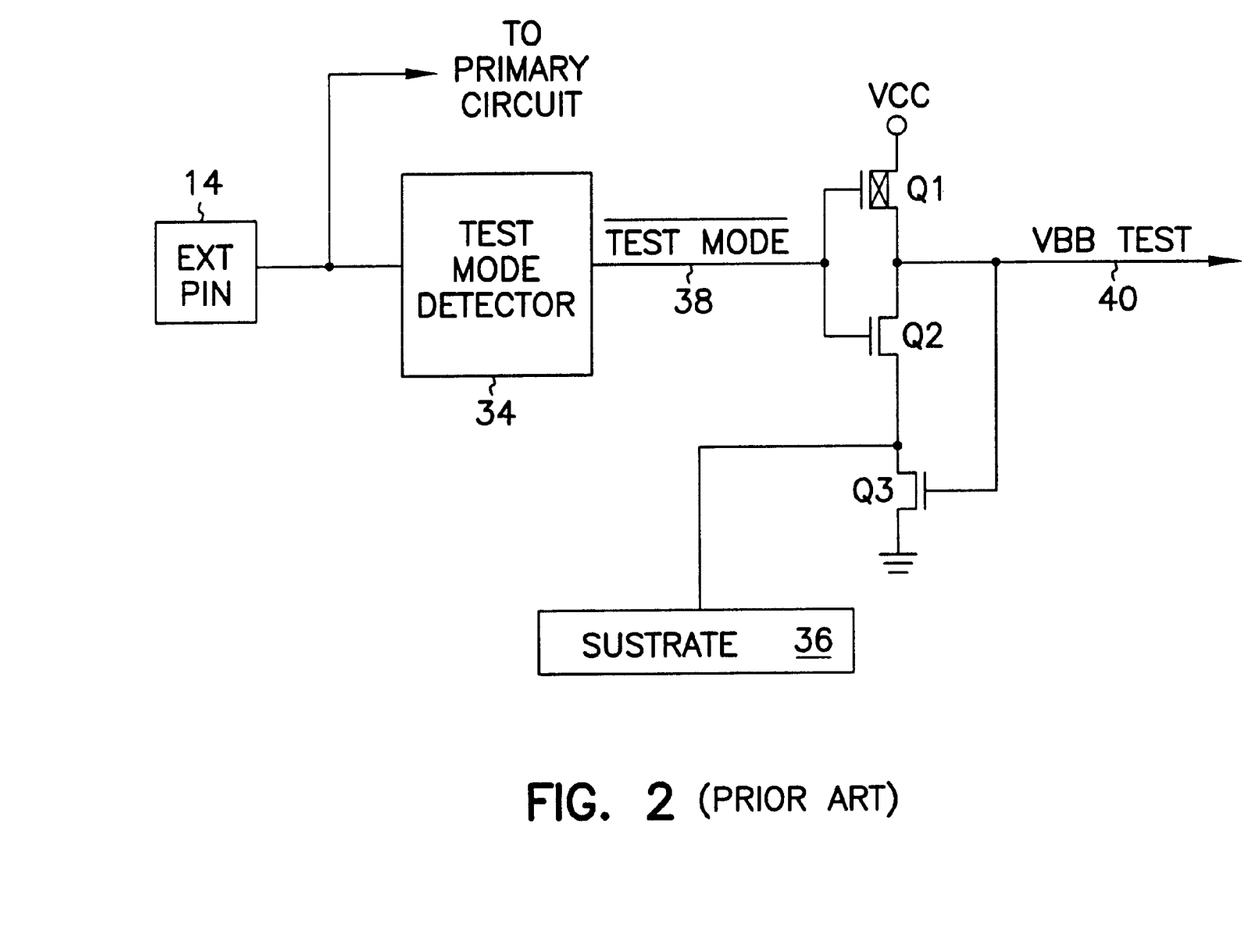
FIG. 2 is a schematic diagram of a prior art substrate forcing circuit.

Referring to FIG. 2, a forcing circuit is shown for forcing an integrated circuit substrate to ground. The forcing circuit of FIG. 2 is manufactured on an integrated circuit together with a primary circuit such as DRAM or SRAM. The integrated circuit is fabricated in a package having a number of external pins in electrical contact with the primary circuit and forcing circuit, but none of the external pins are connected with the integrated circuit substrate. The forcing circuit includes a test mode indicator or detector circuit 34 having an input coupled to an external primary circuit pin 14 and an output for providing a test mode signal TESTMODE* on conductor 38. An N-channel switching transistor Q3 has a drain coupled to the substrate 36, a source coupled to ground, and a gate for receiving the test mode signal VBBTEST, which is logically inverted from TESTMODE*. The TESTMODE* signal is inverted by an inverter stage including a P-channel transistor Q1 and an N-channel transistor Q2.

In the forcing circuit of FIG. 2, the test mode detector 34 can be a supervoltage detector responsive to a boosted type of digital or analog circuit that responds to a combination of inputs not normally allowed during normal operation of the integrated circuit. For example, in a DRAM, applying a CAS* (column address strobe) input signal before a RAS* (row address Strobe) input signal while holding the WE* (write enable) signal low is a sequence that is not encountered or allowed during normal operation. An electronic key circuit can be designed by those skilled in the art to provide a TESTMODE* signal in response to this sequence of input signals. Other types of test mode detector circuits can be designed that recognize an externally applied signal or signals requesting the forced-substrate test mode.

Figure 3:
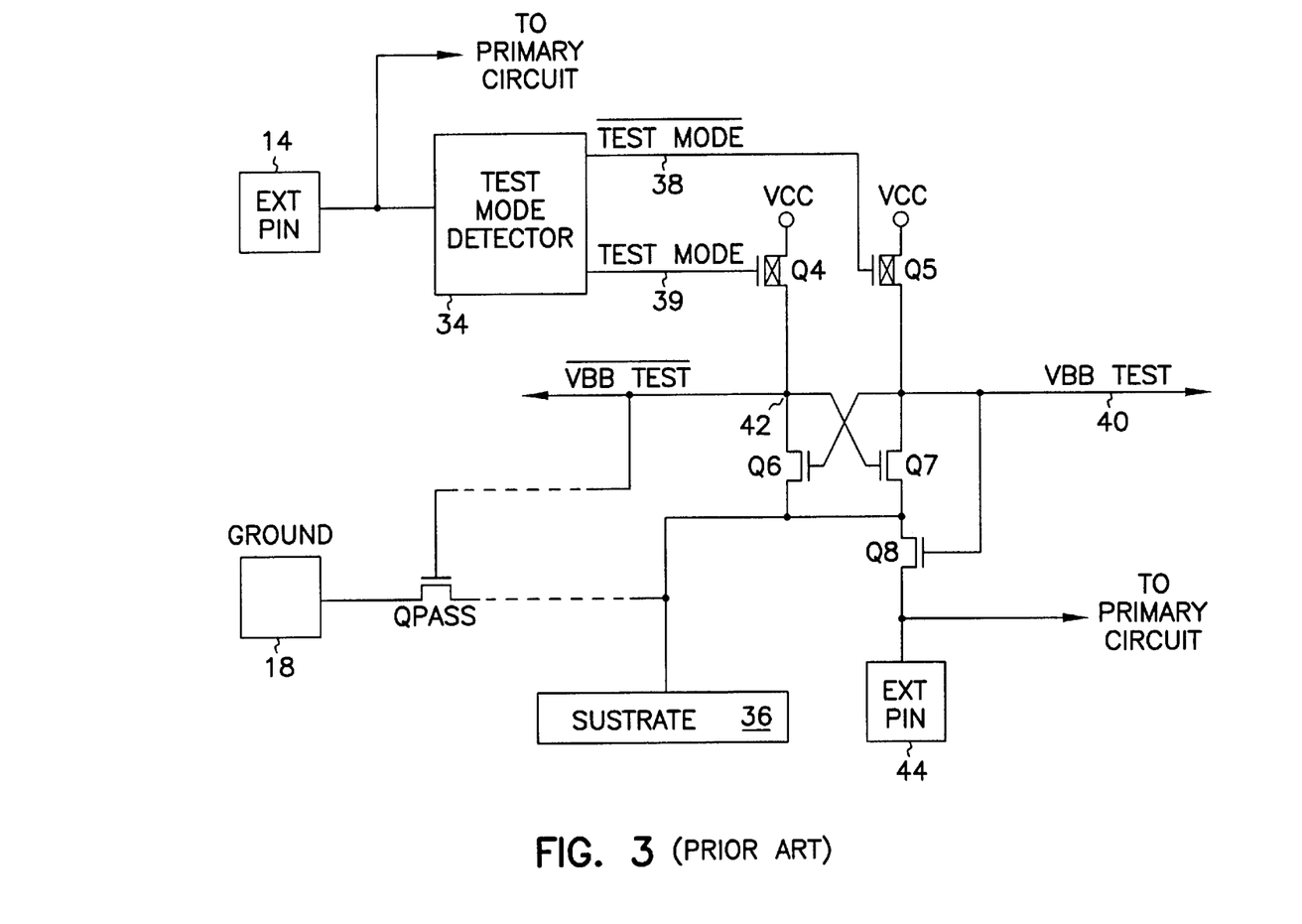
FIG. 3 is a schematic diagram of a prior art substrate forcing circuit.

An alternative forcing circuit that allows connection of any negative voltage to the substrate is shown in FIG. 3. The forcing circuit includes a test mode detector 34 and a switching transistor Q8 for connecting the substrate 36 to a predetermined voltage through an external pin 44. The substrate voltage can be connected to any arbitrary negative voltage. The forcing circuit includes a test mode detector circuit 34 having an input coupled to an external primary circuit pin and an output for providing complementary test mode signals TESTMODE and TESTMODE* on conductors 38 and 39. An N-channel switching transistor Q8 has a drain coupled to the substrate 36, a source coupled to the external pin 44, and a gate for receiving the test mode signal VBBTEST, which is logically inverted from TESTMODE*.

Additional circuitry includes P-channel transistors Q4 and Q5, as well as N-channel transistors Q6 and Q7 to form a positive feedback amplifier for controlling the switching action of transistor Q8, as well as the generation of the VBBTEST signal for disabling the on-chip charge pump, if desired. The gates of transistors Q4 and Q5 respectively receive the TESTMODE and TESTMODE* signals, the sources being coupled to the five volt VCC power supply. The drains and cross coupled gates of transistor Q6 and Q7 are respectively coupled to the drains of transistor Q4 and Q5. The coupled drains of transistors Q5 and Q7 are coupled to the gate of transistor Q8 and form the VBBTEST signal on conductor 40. The sources of transistors Q6 and Q7 are coupled to the substrate 36.

In operation, the forcing circuit of FIG. 3 allows connection of any negative voltage to the substrate 36 through external pin 44 during a test operation. During normal operation TESTMODE* is at a logic high state and TESTMODE is at a logic low state. Transistor Q4 is on and circuit node 42 is at a logic high state. Transistor Q7 is also on and effectively connects the gate of switching transistor Q8 to the substrate 36. During normal operation, the voltage on the substrate 36 is about –1 volts and therefore switching transistor Q8 is off. Assuming that a voltage on external pin 44 is not a threshold voltage below the gate voltage of Q8, the external pin 44 is electrically isolated from the substrate 36. During the substrate-forcing test mode, TESTMODE is at a logic high state and TESTMODE* is at a logic low state. Transistor Q5 turns on, which brings VBBTEST high and turns on transistor Q8. Transistor Q6 is also turned on, which brings node 42 to the substrate potential. Thus, transistor Q7 is turned off, and the substrate 36 and the external pin 44 are electrically coupled together.

A problem with the circuitry of FIG. 3 is electrical isolation of the substrate during normal non-test mode operation. Because external connection 44 is used during operation of the integrated circuit, over-shoot and under-shoot signal voltages can be experienced. An under-shoot voltage which is a threshold voltage (Vt) below the gate of Q8 can couple the substrate to pin 44 and adversely effect the substrate voltage. For the reasons stated above, and for other reasons stated below which will become apparent to those skilled in the art upon reading and understanding the present specification, there is a need in the art for a circuit which the substrate of the integrated circuit is electrically isolated from an external connection during normal operation and which forces the substrate to a predetermined voltage using the external connection during circuit testing.

SUMMARY OF HE INVENTION

The above mentioned problems with integrated circuits and other problems are addressed by the present invention and which will be understood by reading and studying the following specification. The invention isolates, during normal operation, an integrated circuit substrate from external potentials having values less than a breakdown potential of the transistor or switching device coupling the substrate and the external pin during a test mode.

In particular, the present invention describes an integrated circuit comprising an external connection for receiving an input signal voltage, and a test mode detector circuit for producing a test mode signal indicating a test operation in response to a received test command, and electrically coupling the external connection to a substrate of the integrated circuit such that the input signal voltage is coupled to the substrate. The integrated circuit includes an isolation circuit coupled between the external connection and the substrate to electrically isolate the external connection from the substrate during non-test operations, whereby an input signal voltage having a potential which is less than an n-channel threshold voltage below a substrate voltage remains isolated from the substrate.

In another embodiment, an integrated circuit memory device comprises an array of memory cells, a substrate, and an input connection for receiving an externally provided signal voltage having an upper voltage level and a lower voltage level during non-test mode operations. A test mode detector circuit is provided for detecting the activation of a test operation and generating first and second output signals. The integrated circuit memory device also comprises an isolation circuit coupled between the input connection and the substrate to electrically isolate the input connection from the substrate during non-test operations such that the lower voltage level received on the input connection during non-test mode operations can be more than a threshold voltage below the substrate voltage, and wherein the input connection is electrically coupled to the substrate via the isolation circuit during test mode operations.

A method of operating in integrated circuit memory device having a substrate is described. The method comprises steps of initiating a test mode, electrically coupling an external input connection to the substrate during the test mode, providing a potential voltage on the external input connection to establish a substrate voltage during the test mode, and terminating that test mode. The method also includes electrically de-coupling the external input connection from the substrate in response to the step of terminating, such that a negative potential can be coupled to the external input connection which is less than a transistor threshold voltage below a substrate voltage during non-test mode operation.

DETAILED DESCRIPTION OF THE INVENTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 4:
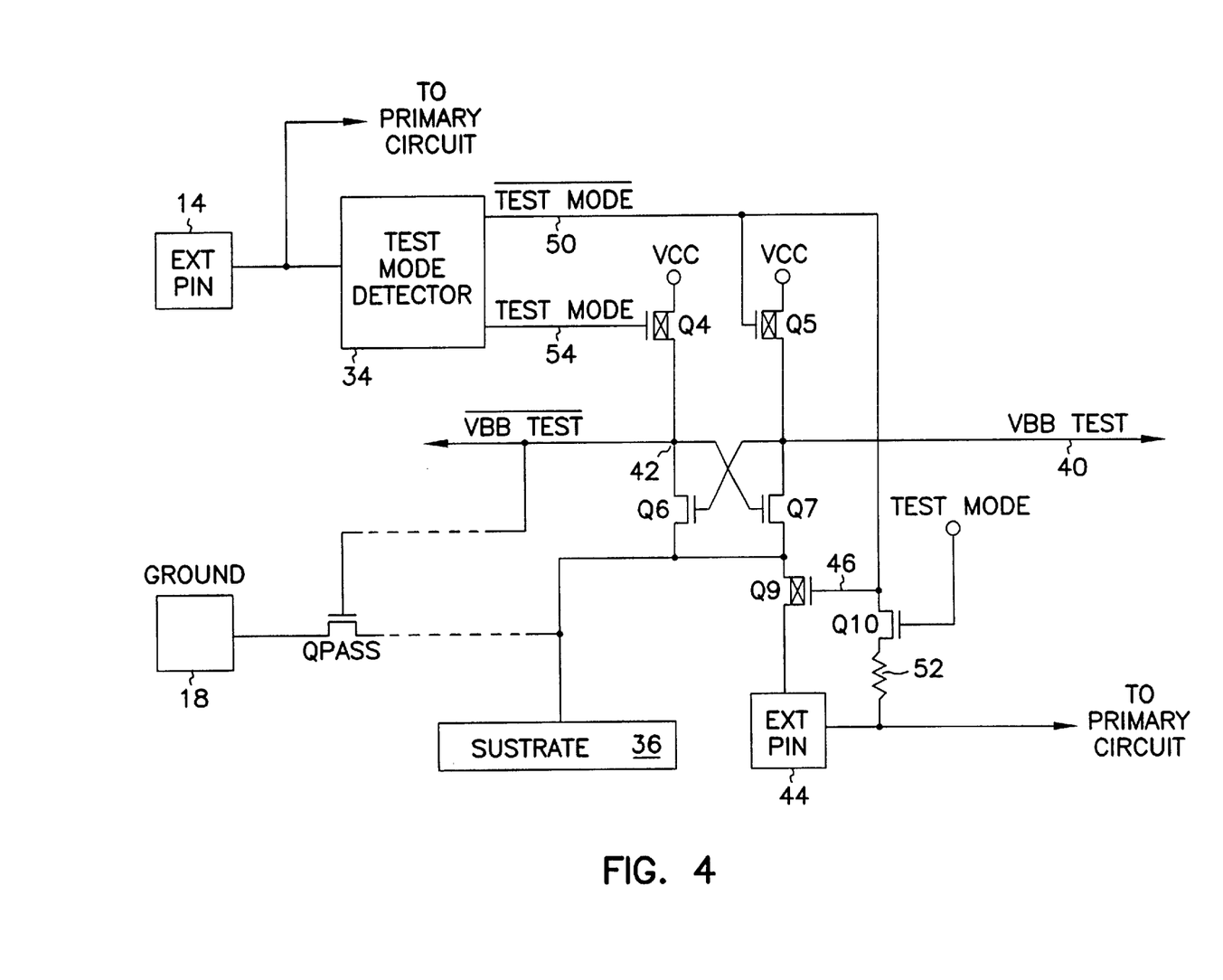
FIG. 4 is a schematic diagram of a substrate forcing circuit of the present invention.

An embodiment of the integrated circuit of the present invention is depicted schematically in FIG. 4. Similar components of FIG. 4 are numbered the same as those in FIG. 3. In FIG. 4, the n-channel transistor Q8 of FIG. 3, is replaced with a p-channel transistor Q9. The use of the p-channel transistor Q9 prevents the substrate from attaning a negative potential in response to a user driving external pin 44 to a negative potential during normal operation of the memory circuit. The gate 46 of Q9 Is connected to TESTMODE* node 50 such that the actuation and deactuation of Q9 is controlled by the potential on TESTMODE* node 50. The gate 46 of Q9 is also connected to external pin 44 through resistor 52 when transistor Q10, interposed between gate 46 and resistor 52, is actuated. The actuation of transistor Q10 is controlled by the potential on TESTMODE node 54. The potential on TESTMODE* node 50 and TESTMODE node 54 are complementary. Thus, during normal operation the potential on TESTMODE* node 50 is high and transistors Q9 and Q10 are deactuated thereby electrically isolating external pin 44 from the substrate. During this deactuation, no matter how negative a user drives the potential of external node 44 transistor Q9 remains deactuated, unlike the case shown in FIG. 3 where the n-channel Q8 could inadvertently actuate in response to a negative potential on external pin 44 (a threshold voltage below the substrate level) hereby driving the potential of the substrate negative. That is, p-channel transistor Q9 is formed in its own n-well and will not be forward biased by a negative voltage on node 44. Resistor 52 insures that the gate of Q9 is within a Vtp of node 44 during a test mode, but prevents transistor Q10 from inadvertently activating during normal non-test operation, as explained below.

During a test mode the potential on TESTMODE* node 50 is low, and transistors Q9 and Q10 are actuated by the signal at TESTMODE* node 50 and TESTMODE node 54, respectively. A voltage drop occurs across resistor 52 which is interposed between gate 46 and external pin 44. The voltage drop at resistor 52 is designed to ensure that the potential at gate 46 is maintained to be within a threshold voltage of the potential on the external node 44. Actuated transistor Q9 couples external node 44 to the substrate. Thus, the potential of the substrate follows the potential of external pin 44 but never attains the potential of external pin 44 due to the voltage drop at resistor 52. Therefore, transistor Q9 can be thought of as a tracking component, because it allows the substrate voltage to track the voltage of the external pin 44 during the test mode. Transistor Q10 is not activated during non-test operations due to resistor 52. That is, resistor 52 creates a sufficient voltage drop to prevent the inadvertent activation of Q10 for a specified under-shoot voltage signal range on node 44.

Figure 5:
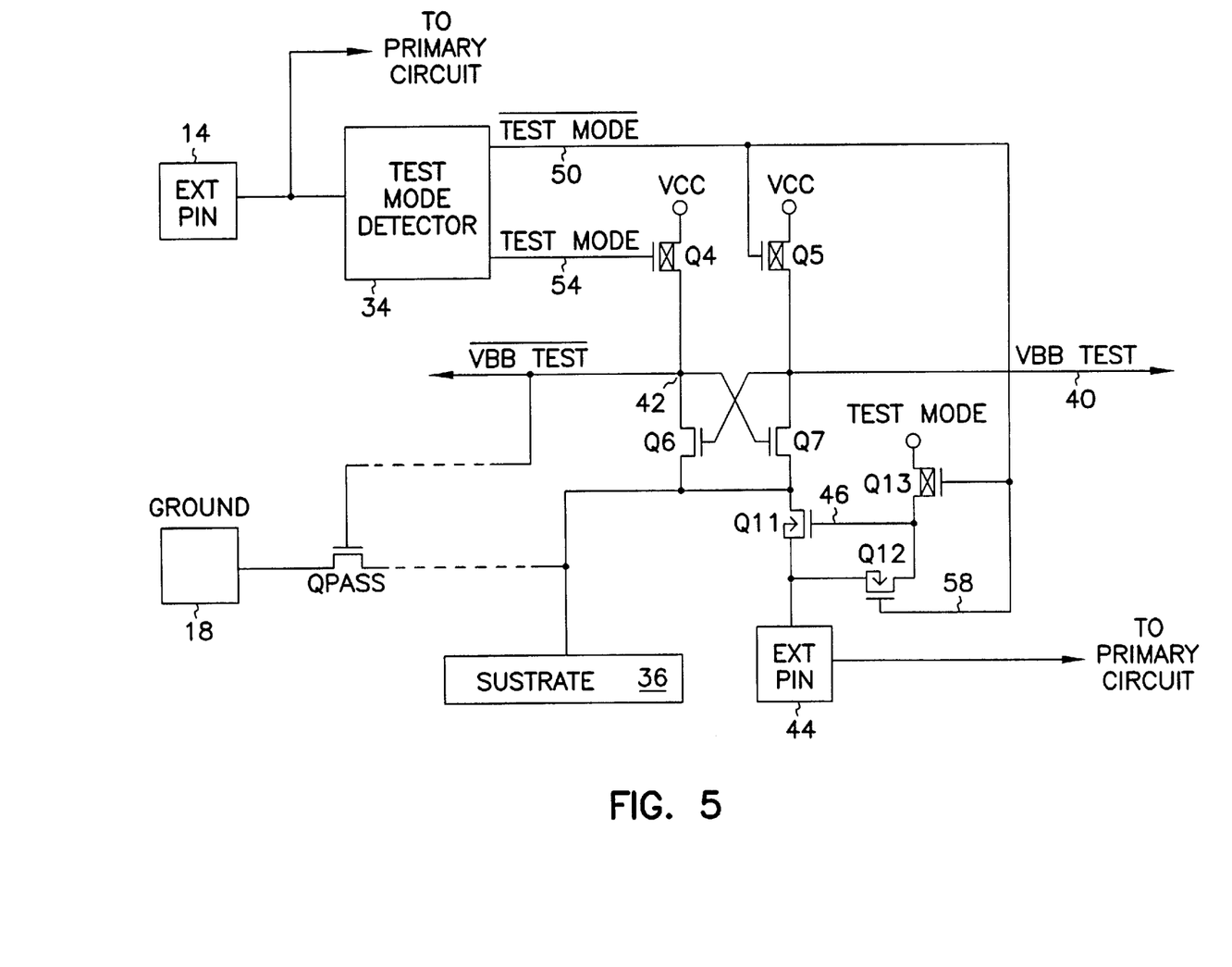
FIG. 5 is a schematic diagram of an alternate substrate forcing circuit of the present invention.

Although the above circuit isolates the substrate from the external node 44 better than the circuit of FIG. 3, it may be desired to couple node 44 to the substrate without the voltage drop resulting from resistor 52. To overcome this problem, a further embodiment of the integrated circuit of the invention is depicted schematically in FIG. 5 which includes n-channel transistors. Similar components in FIG. 5 are numbered the same as those in FIG. 4. In this embodiment, Q9 and Q10 of FIG. 4 are replaced with n-channel transistors Q11 and Q12, respectively. Transistors Q11 and Q12 are formed in a p-well or p-wells isolated from the substrate. A further p-channel transistor Q13, also formed in an-well isolated from the substrate, is used to control the actuation and deactuation of Q11. By isolating Q11, Q12 and Q13 from the substrate, a negative potential can be applied to external node 44 during normal operation without driving this negative potential to the substrate.

Transistor Q12 is interposed between the gate 46 of Q11 and external pin 44, and transistor Q13 is interposed between TESTMODE node 54 and gate 46 of Q11. The gates 58 of Q12 and Q13 are connected to TESTMODE* node 50. When the potential of TESTMODE* node 50 is low, Q13 actuates and Q12 deactuates. When Q13 actuates, the gate 46 of Q11 is driven to the positive potential of TESTMODE node 54 and actuates Q11 coupling the potential on external pin 44 to the substrate through Q11.

During normal non-test operation the potential on TESTMODE* node 50 is high, Q13 deactuates and Q12 actuates, coupling the gate of Q11 to the external pin 44. Therefore, even when the potential of external pin 44 goes negative, Q12 remains deactuated, isolating the substrate from the negative potential on external pin 44. This embodiment allows for a full coupling of node 44, during a test mode, to the substrate without a voltage low due to resistor 52. Further, this circuit provide much improved isolation during non-test operation.

The present invention is applicable to integrated circuits, and can be implemented in a memory device such as a dynamic random access memory (DRAM. A DRAM 100 is described in reference to FIG. 6 as having a memory array 102 and associated circuitry for reading from and writing to the memory array. The memory array is arranged in an x-y grid, or rows and columns of memory cells. The DRAM array can be accessed by a microprocessor 104, memory controller, a chip set, or other external system through input/output connections including address lines A0–Ax. Row decoder 106 decodes a row address from an address signal provided on A0–Ax, and addresses the corresponding row of the DRAM array. Likewise, column decoder 108 decodes a column address from an address signal provided on A0–Ax, and addresses the corresponding column of the DRAM array. Data stored in the DRAM array can be transferred to outputs DQ1–DQx through the data output buffer 110. Likewise, data input buffer 112 is used to receive data from DQ1–DQx and transfer the data to the DRAM array. Sense amplifier circuitry 114 is provided to sense and amplify data stored on the individual memory cells of the DRAM array. Control circuitry 116 is provided to monitor the memory circuit inputs and control reading and writing operations.

Figure 6:
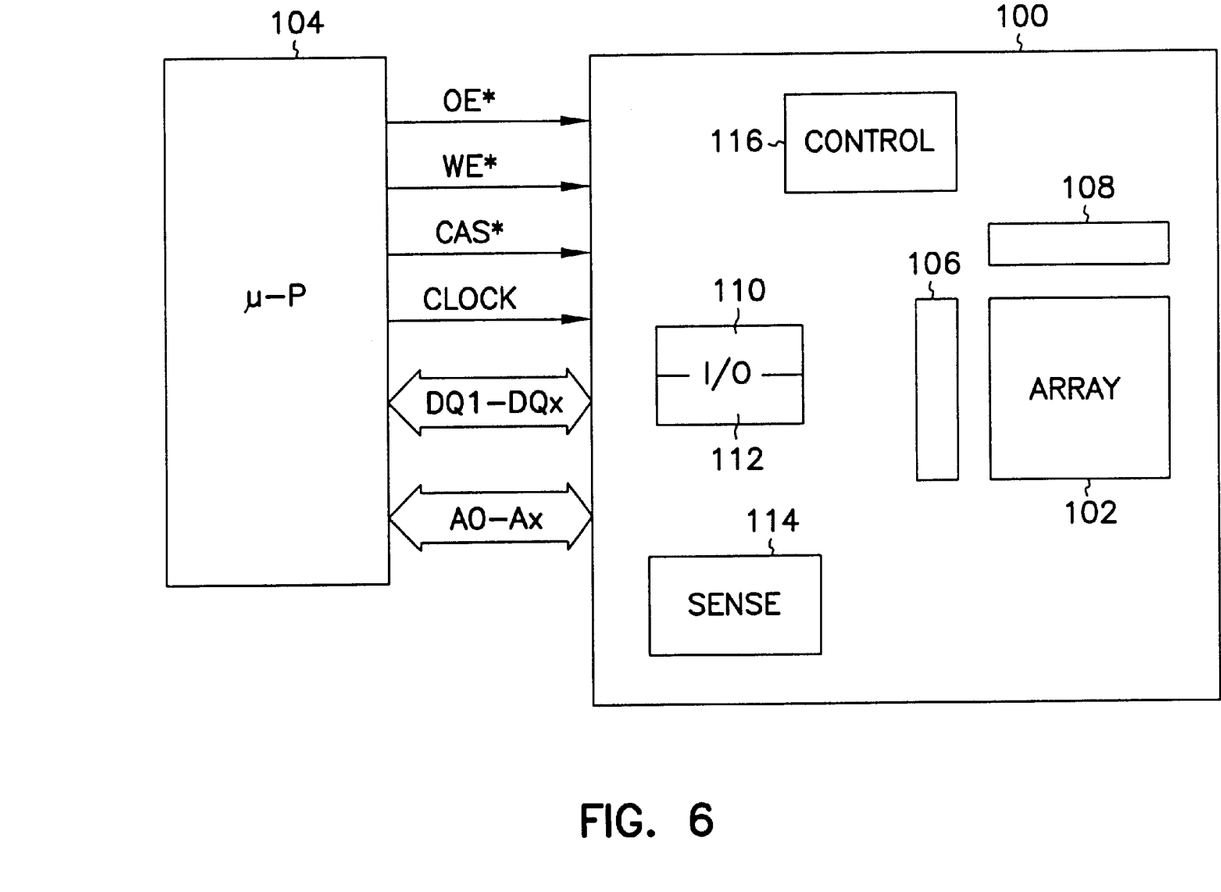
FIG. 6 is a block diagram of a DRAM of the present invention.

The input and output connections of the DRAM 100 used to communicate with the microprocessor 104 are described as follows. Output enable (OE*) enables the output buffer 110 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines A0–Ax are used to identify a row and column address. DRAM data input/output lines DQ1–DQ1 provide data input and output for the DRAM. An optional clock signal can be provided by the microprocessor as described below for operating the memory circuit in a synchronous mode. As stated above, external connection 44 can be one of the address input pins A0–Ax of the memory device.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

CONCLUSION

An integrated circuit has been described which includes a test mode circuit that allows a substrate of the integrated circuit to be forced to a voltage level dictated by an external connection during a test operation, and provides an improved substrate isolation from the external connection during non-test operations. Both n-channel transistor and p-channel transistor isolation circuit embodiments have been described. An integrated circuit memory device has been described which incorporated the test mode and isolation circuits.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   an external connection for receiving an input signal from an external source; and
   an isolation circuit coupled between the external connection and a substrate of the integrated circuit to electrically isolate the external connection from the substrate during non-test operations to isolate all input signal voltages from the substrate, including input signal voltages having a voltage which is less than a threshold voltage below a substrate voltage.

2. The integrated circuit of claim 1 wherein the isolation circuit comprises:
   a first n-channel transistor having a drain coupled to the external connection, and a source coupled to the substrate;
   a second n-channel transistor having a drain coupled to the external connection, a source coupled to a gate of the first n-channel transistor, and a gate coupled to receive a control signal that is low during a test mode; and
   a p-channel transistor having a drain coupled to receive an inverse of the control signal, a source coupled to the gate of the first n-channel transistor, and a gate coupled to the gate of the second n-channel transistor.

3. The integrated circuit of claim 2 wherein the first and second n-channel transistors are formed in at least one p-type isolation well.

4. The integrated circuit of claim 1 wherein the integrated circuit is a memory device.

5. The integrated circuit of claim 4 wherein the external connection is an address signal input connection.

6. The integrated circuit of claim 1 wherein the isolation circuit comprises:
   a p-channel transistor having a source coupled to the external connection, a drain coupled to the substrate, and a gate coupled to receive a control signal that is low during a test mode; and
   an n-channel transistor having a drain connected to the gate of the p-channel transistor, a source connected to a resistor, and a gate connected to receive an inverse of the control signal, the resistor is connected between the source of the n-channel transistor and the external connection.

7. The integrated circuit of claim 1 wherein the external connection remains isolated from the substrate when the input signal voltage is between −1 and −3 volts.

8. The integrated circuit of claim 1 further comprising circuitry for coupling the substrate to a ground potential during non-test operation, and decoupling the substrate from the ground potential during test operations.

9. An integrated circuit memory device comprising:
   an array of memory cells;
   a substrate;
   an external connection for receiving an input signal from an external source; and
   an isolation circuit coupled between the external connection and the substrate to electrically isolate the external connection from the substrate during non-test operations to isolate from the substrate all input signal voltages applied to the external connection, including input signal voltages having a voltage which is less than an n-channel threshold voltage below a substrate voltage.

10. The integrated circuit memory device of claim 9 wherein the isolation circuit comprises:
    a first n-channel transistor having a drain coupled to the external connection, and a source coupled to the substrate;
    a second n-channel transistor having a drain coupled to the external connection, a source coupled to a gate of the first n-channel transistor, and a gate coupled to receive a control signal that is low during a test mode; and
    a p-channel transistor having a drain coupled to receive an inverse of the control signal, a source coupled to the gate of the first n-channel transistor, and a gate coupled to the gate of the second n-channel transistor.

11. The integrated circuit memory device of claim 9 wherein the external connection is an address signal input connection.

12. The integrated circuit memory device of claim 9 wherein the isolation circuit comprises:
    a p-channel transistor having a source coupled to the external connection, a drain coupled to the substrate, and a gate coupled to receive a control signal that is low during a test mode; and
    an n-channel transistor having a drain connected to the gate of the p-channel transistor, a source connected to a resistor, and a gate connected to receive an inverse of the control signal, the resistor is connected between the source of the n-channel transistor and the external connection.

13. The integrated circuit memory device of claim 9 further comprising circuitry for coupling the substrate to a ground potential during non-test operation, and the coupling the substrate from the ground potential during test operations.

14. A method of operating an integrated circuit memory device having a substrate, the method comprising:
    electrically coupling an external input connection to the substrate during a test mode of operation;
    providing a voltage on the external input connection from an external source to establish a substrate voltage during the test mode of operation;
    electrically de-coupling the external input connection from the substrate such that any voltage, including one having a potential which is less than an n-channel threshold voltage below a substrate voltage, can be coupled to the external input connection during the non-test mode of operation and remain decoupled from the substrate.

15. The method of claim 14 wherein electrically coupling comprises:
    activating a p-channel transistor coupled between the substrate and the external connection; and
    activating an n-channel transistor coupled between the external connection via a resistor, and a gate of the p-channel transistor.

16. The method of claim 15 wherein electrically de-coupling comprises turning off the p-channel transistor and the n-channel transistor.

17. The method of claim 14 wherein electrically coupling comprises:
activating a first n-channel transistor coupled between the external connection and the substrate; and
turning off a second n-channel transistor coupled between a gate of the first n-channel transistor and the external connection.

18. The method of claim 17 wherein electrically de-coupling comprises turning off the first n-channel transistor, and activating the second n-channel transistor.

19. An integrated circuit comprising:
an external connection for receiving an input signal; and
an isolation circuit coupled between the external connection and a substrate of the integrated circuit comprising:
a first n-channel transistor having a drain coupled to the external connection, and a source coupled to the substrate,
a second n-channel transistor having a drain coupled to the external connection, a source coupled to a gate of the first n-channel transistor, and a gate coupled to receive a control signal that is low during a test mode, and
a p-channel transistor having a drain coupled to receive an inverse of the control signal, a source coupled to the gate of the first n-channel transistor, and a gate coupled to the gate of the second n-channel transistor.

20. An integrated circuit comprising:
an external connection for receiving an input signal; and
an isolation circuit coupled between the external connection and a substrate of the integrated circuit comprising:
a p-channel transistor having a source coupled to the external connection, a drain coupled to the substrate, and a gate coupled to receive a control signal that is low during a test mode; and
an n-channel transistor having a drain connected to the gate of the p-channel transistor, a source connected to a resistor, and a gate connected to receive an inverse of the control signal, the resistor is connected between the source of the n-channel transistor and the external connection.

21. An integrated circuit memory device comprising:
an array of memory cells;
a substrate;
an external connection for receiving an input signal; and
an isolation circuit coupled between the external connection and the substrate comprising:
a first n-channel transistor having a drain coupled to the external connection, and a source coupled to the substrate,
a second n-channel transistor having a drain coupled to the external connection, a source coupled to a gate of the first n-channel transistor, and a gate coupled to receive a control signal that is low during a test mode, and
a p-channel transistor having a drain coupled to receive an inverse of the control signal, a source coupled to the gate of the first n-channel transistor, and a gate coupled to the gate of the second n-channel transistor.

22. An integrated circuit memory device comprising:
an array of memory cells;
a substrate;
an external connection for receiving an input signal; and
an isolation circuit coupled between the external connection and the substrate comprising:
a p-channel transistor having a source coupled to the external connection, a drain coupled to the substrate, and a gate coupled to receive a control signal that is low during a test mode; and
an n-channel transistor having a drain connected to the gate of the p-channel transistor, a source connected to a resistor, and a gate connected to receive an inverse of the control signal, the resistor is connected between the source of the n-channel transistor and the external connection.

23. A method of operating in integrated circuit memory device having a substrate, the method comprising:
during a test mode operation, activating a p-channel transistor coupled between the substrate and an external connection, and activating an n-channel transistor coupled between the external connection via a resistor, and a gate of the p-channel transistor;
providing a voltage on the external input connection to establish a substrate voltage during the test mode operation; and
deactivating the p-channel and n-channel transistors during non-test mode operation.

24. A method of operating in integrated circuit memory device having a substrate, the method comprising:
during a test mode operation, activating a first n-channel transistor coupled between an external connection and the substrate, and turning off a second n-channel transistor coupled between a gate of the first n-channel transistor and the external connection;
providing a voltage on the external input connection to establish a substrate voltage during the test mode operation; and
during a non-test mode operation, turning off the first n-channel transistor, and activating the second n-channel transistor.

25. The integrated circuit of claim 19 wherein the first and second n-channel transistors are formed in at least one p-type isolation well.

26. The integrated circuit of claim 19 wherein the integrated circuit is a memory device.

27. The integrated circuit of claim 26 wherein the external connection is an address signal input connection.

28. The integrated circuit of claim 20 wherein the external connection remains isolated from the substrate when the input signal voltage is between −1 and −3 volts.

29. The integrated circuit of claim 20 further comprising circuitry for coupling the substrate to a ground potential during non-test operation, and decoupling the substrate from the ground potential during test operations.

30. The integrated circuit of claim 21 wherein the first and second n-channel transistors are formed in at least one p-type isolation well.

31. The integrated circuit of claim 21 wherein the integrated circuit is a memory device.

32. The integrated circuit of claim 31 wherein the external connection is an address signal input connection.

33. The integrated circuit of claim 22 wherein the external connection remains isolated from the substrate when the input signal voltage is between −1 and −3 volts.

34. The integrated circuit of claim 22 further comprising circuitry for coupling the substrate to a ground potential during non-test operation, and decoupling the substrate from the ground potential during test operations.

* * * * *